United States Patent [19]

Popat et al.

[11] Patent Number: 5,327,318
[45] Date of Patent: Jul. 5, 1994

[54] TELECOMMUNICATION EQUIPMENT PROTECTOR

[75] Inventors: Pravin N. Popat, Norton; Diethard Unterweger, Plainville; Gennady Baskin, Sharon; Ronald J. Candelet, Attleboro; Gary L. Tonnies, North Attleboro, all of Mass.

[73] Assignee: Texas Instruments Incorporated, Dallas, Tex.

[21] Appl. No.: 987,038

[22] Filed: Dec. 7, 1992

[51] Int. Cl.⁵ .............................................. H02H 9/04
[52] U.S. Cl. ..................................... 361/55; 361/103; 361/111
[58] Field of Search ................... 361/54, 55, 103, 111; 174/52.4

[56] References Cited

U.S. PATENT DOCUMENTS 5,130,882  7/1992  Hilland ................................ 361/111
5,164,877  11/1992  Furahata et al. ..................... 361/111

*Primary Examiner*—Todd E. DeBoer
*Attorney, Agent, or Firm*—Russell E. Baumann; Richard L. Donaldson; Rene E. Grossman

[57] ABSTRACT

A surge protection device to protect telecommunication equipment coupled to telephone lines is shown having in a first embodiment three cells with each cell having a semiconductor element with a reverse breakdown PN junction mounted on a heat sink. The device includes a lead frame having a first pair of leads formed with a platform raised out of the plane of the remainder of the lead frame to provide suitable clearance relative to the semiconducting elements and each platform has a finger extending downwardly into engagement with a top electrode of a respective semiconducting element and is soldered thereto. A second lead lies in the plane of the lead frame and is soldered to a first heat sink plate mounting two semiconducting elements and another finger extending from one of the platforms is soldered to a second heat sink plate mounting the third semiconducting element. The heat sinks, semiconducting elements and portions of the leads are encapsulated in thermally conductive, electrically insulative epoxy. The device, when subjected to excessive current and voltage conditions, is adapted to fail closed. A second embodiment has two cells mounted on a single heat sink plate mounted in the same manner as in the first embodiment.

5 Claims, 4 Drawing Sheets

TELECOMMUNICATION EQUIPMENT PROTECTOR

BACKGROUND OF THE INVENTION

The field of the invention is that of surge protection systems and more particularly to protectors for high voltage and current transients that may occur on telephone tip or ring lines.

Solid state surge protection systems conventionally employ a surge protection device having a semiconducting element disposed between a pair of electrodes. This element is arranged in the circuit to selectively conduct electrical energy between the tip line and common, the ring line and common and, if desired, between the tip line and the ring line. For example, in the event the telephone circuit experiences an electrical surge as a result of lightning or A.C. line cross or the like in the circuit, the system is designed to shunt current from and thereby to protect telecommunication equipment connected in the circuit from damage due to the surge condition. On occasion, the circuit may experience an electrical surge which results in destruction of the semiconducting element so that the circuit components and telecommunication equipment would not thereafter be protected against subsequent occurring electrical surge conditions. Accordingly, the conventional surge protection systems typically incorporate means designed to move the electrodes into electrical engagement with each other following destruction of the semiconducting element, thereby to maintain a short circuit condition between the electrodes to protect the circuit components and telecommunication equipment coupled to the circuit against subsequently occurring transient surge conditions until such time as the semiconducting element is replaced. For example, the device electrodes in a typical system are resiliently engaged between spring loaded electrical contact arms or the like to be biased together by the spring contact arm loading in the event the semiconducting element is destroyed by the noted surge conditions. Frequently, however, difficulty is encountered in establishing and maintaining the desired short circuit condition between the electrodes following destruction of the semiconducting element.

In copending application, Ser. No. 07/720980, an improved surge protection device is described and claimed comprising a semiconducting element having first and second electrodes disposed in electrically conductive relation with respective opposite sides of the element and the element is normally operable to selectively conduct electrical energy between the electrodes to provide a first level of surge protection for the circuit. The element becomes conductive, for example, on occurrence of selected surge voltage in the circuit due to lightning or the like for connecting the circuit to ground to protect the circuit and circuit components from the voltage surge. When the surge condition has passed, the semiconducting element returns to its nonconducting condition permitting resumption of normal circuit operation. In the event the device is destroyed as a result of being subjected to a greater electrical surge exceeding the first level of surge as described above, the electrodes are adapted to contact each other to maintain a short circuit condition to thereby provide a second level of surge protection. A first one of the electrodes is disposed in electrical engagement with a limited portion of one side of the semiconducting element to facilitate establishment and maintenance of the desired short circuit condition between the electrodes in the event of element destruction. The first electrode comprises a disc part and post of lesser cross sectional size than the disc part. A distal end of the post part of the first electrode is secured in electrically conductive relation to the selected limited portion of the said one side of the element whereby as destruction of the semiconducting element occurs along a critical energy condition path, the post part of the electrode passes through the element along that path to be electrically engaged in short circuit condition with the second electrode for providing the second level of surge protection. While this protective device is effective it would be desirable to provide a device which is particularly suitable for mounting on a circuit board.

BRIEF SUMMARY OF THE INVENTION

It is an object of the invention to provide a novel and improved surge protection device which is particularly suitable for mounting on a circuit board; to provide such an improved surge protection device which provides surge protection with improved reliability and to provide such a surge protection device which provides desired surge protection with improved speed for protecting circuit components in the system on occasion of a substantial electrical surge in the system.

Briefly, in accordance with the invention, a semiconducting element having a reverse breakdown PN junction and having a first electrode disposed in the center of one face of the element and a second electrode disposed on an opposed face of the element is mounted on a heat sink with the second electrode electrically connected therewith. A lead frame formed of nickel plated copper lying in a plane has a pair of first leads each having a cross sectional area of at least approximately 800 square mils is formed so that it has a platform portion raised out of the plane and having first and second downwardly and transversely extending fingers each having a horizontally extending pad formed at the distal end thereof, one lying in the plane and the other lying either in the plane or intermediate the plane and the platform portion. The lead frame has a second lead lying in the plane of the lead frame. A heat sink having first and second spaced semiconducting elements mounted thereon with a selected quantity of electrically conductive solder paste placed on each first electrode is placed beneath the first and second leads and a force is placed on the platform portion of each lead so that the pad of each first finger is biased against a respective first electrode. The pads of the first leads are soldered to a central portion of the first electrode of a respective semiconducting element with sufficient solder that the solder forms a meniscus with the side wall of the pad around at least a portion of its periphery. The second electrode is soldered to the heat sink using a conventional quantity of solder. A second heat sink having a single semiconductor element mounted thereon is placed beneath the pad of one second finger with the heat sink surface disposed beneath the pad of the other second finger forming a three cell protector. In a second embodiment two cells are provided by mounting two semiconducting elements on a single heat sink plate as in the first embodiment. The protector comprising three semiconductor elements of the first embodiment or two semiconductor elements of the second embodiment is then encapsulated in a thermally conductive, electrically insulative material and finally the leads are severed from the lead frame to complete the protector.

In the event that the protector is subjected to voltage and current conditions of such a magnitude that the semiconducting element is destroyed the solder will melt and flow into voids formed in the silicon of the semiconducting element thereby forming an electrical bridge between a pad and the respective vertically aligned second electrode.

The solder employed is highly conductive comprising approximately 65% tin, 25% silver and 10% antimony.

DESCRIPTION OF THE DRAWINGS

Other objects, advantages and details of the novel and improved surge protector device and system of the invention appear in the following detailed description of preferred embodiments of the invention, the detailed description referring to the drawings in which.

DESCRIPTION OF THE PREFERRED EMBODIMENTS

Figure 1:
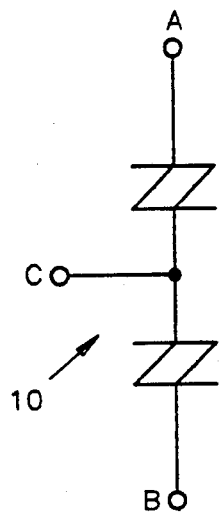
FIGS. 1 and 2 are electrical schematics of first and second embodiments respectively, of a protector made in accordance with the invention.
Figure 2:
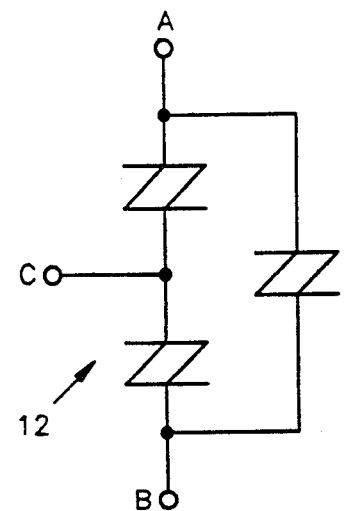
Figure 3:
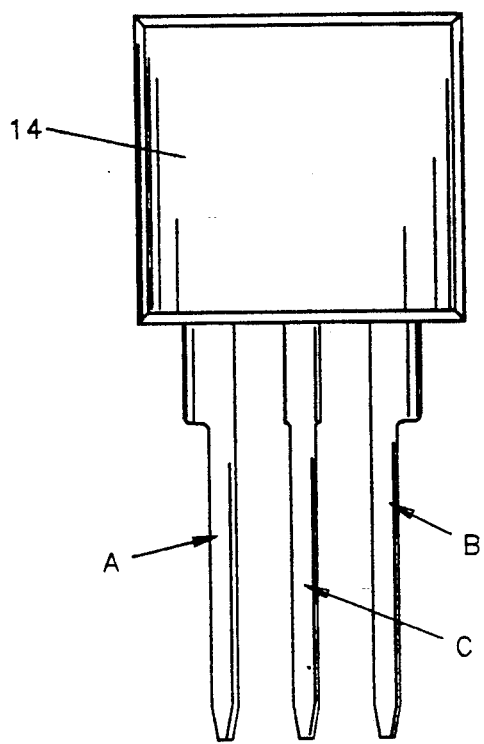
FIGS. 3 and 4 are front and side view respectively of the FIG. 1 or 2 protector.
Figure 4:
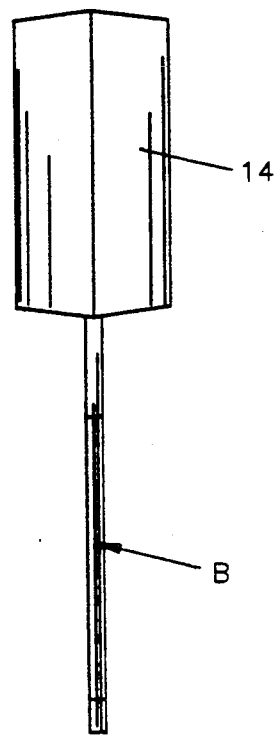
Figure 5:
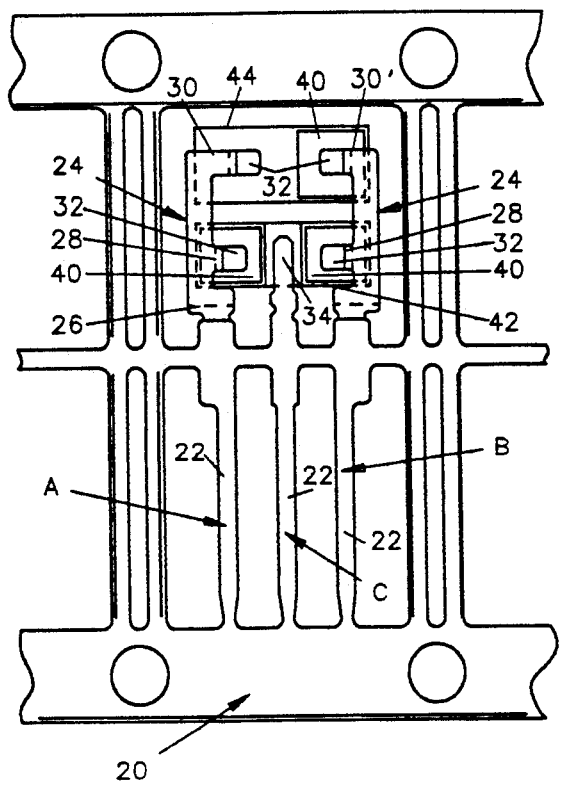
FIGS. 5 and 6 are top and side views respectively of a partially assembled device shown schematically in FIG. 2.
Figure 6:
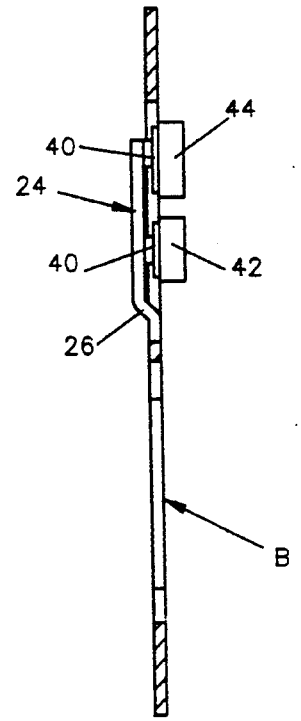
Figure 7:
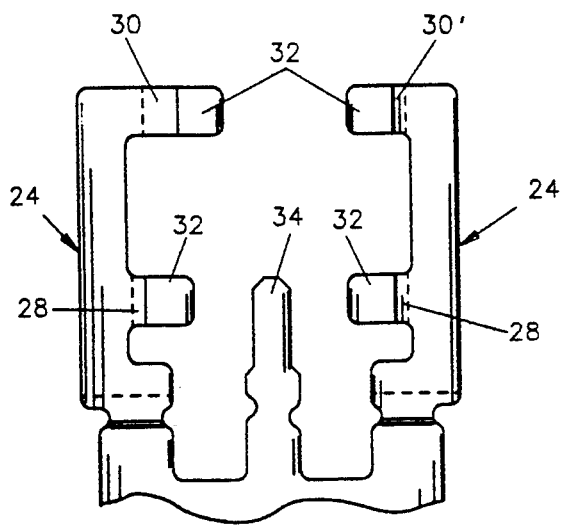
FIGS. 7 and 8 are top and rear views respectively of a portion of the lead frame shown in FIGS. 5 and 6.

Referring to the drawings, numeral 10 of FIG. 1 represents a two cell protective device and numeral 12 in FIG. 2 represents a three cell protective device both made in accordance with the invention. The terminals A, B and C represent ring, tip and coon lines respectively of conventional telephone lines. A device having either two or three cells is shown in FIGS. 3 and 4 comprising a housing formed of encapsulating material 14 from which extend a pair of first leads A, B and a second or center lead C.

With particular reference to FIGS. 5-12 which relate to a three cell device, a lead frame 20 formed of suitable electrically conductive material such as CDA151 or KFC copper having a thickness of approximately 0.020 inches plated with a thin coating of sulphamate nickel in a conventional manner is formed with a pair of first leads A and B having a terminal portion 22 of conventional width, e.g., 0.030 inches, for connection to a circuit board in a known manner which lie in a plane in which the upper and lower runners of the lead frame lie. Leads A and B are each formed with a platform portion 24 raised above the plane of the lead frame by forming a bend at 26 to provide a selected spacing from semiconducting elements to be described below. First and second fingers 28 and 30 of lead A and 28 and 30' of lead B extend transversely from the platform portions toward each other and downwardly toward the plane of the lead frame and culminate in horizontally extending pads 32. Platform 24 and fingers 28, 30, 31' have a width of approximately 0.040 inches so that the cross sectional area of the platform and fingers is approximately 800 square mils and the pads are generally configured to have a lower surface in the form of a square with a side of 0.040 inch.

Lead C has a terminal portion 22 of the same width as that of leads A and B and has a pad portion 34 which lies in the plane of the lead frame and extends approximately to an imaginary line drawn between the extremity of fingers 28 of leads A and B and is somewhat thinner in width, i.e., approximately 0.032 inch.

In a preferred embodiment of the invention the device comprises, for each cell, a bidirectional silicon semiconductor element made and sold by Texas Instruments Incorporated having a reverse breakdown PN junction similar to TISP3180 element shown in UK Patent Publication 2113907B. In the three cell embodiment of FIG. 2 first and second semiconductor elements 40 are mounted on a first heat sink 42 spaced transversely from each other and a third semiconductor element 40 is mounted on a second heat sink 44 on the right side thereof as viewed in FIG. 5. Elements 40 are electrically and physically attached to the heat sink by suitable means such as by means of a highly silver filled conductive epoxy.

Heat sinks 42, 44 are formed of suitable electrically and thermally conductive material such as the sulphamated nickel plated copper of the lead frame but having a thickness approximately 0.040 inches and each having a length approximately 0.295 inches and a width approximately 0.123 inches.

Heat sinks 42, 44 are placed beneath pads 32 with heat sink 42 positioned so that a pair of fingers 28 are aligned with the central portion of a respective semiconductor element 40 and with heat sink 44 positioned so that pad 32 of finger 30' is aligned with a central portion of a third semiconductor 40.

Semiconductor elements 40 are formed with a bottom electrode on the bottom surface which is at the same electrical potential as that of the sides of the element which extend to the outer periphery of the opposed top surface. A top electrode is disposed on the central portion of the top surface separated from the outer periphery by an insulative berm. A thin gold coating is placed on the electrode on the top surface.

Figure 9:
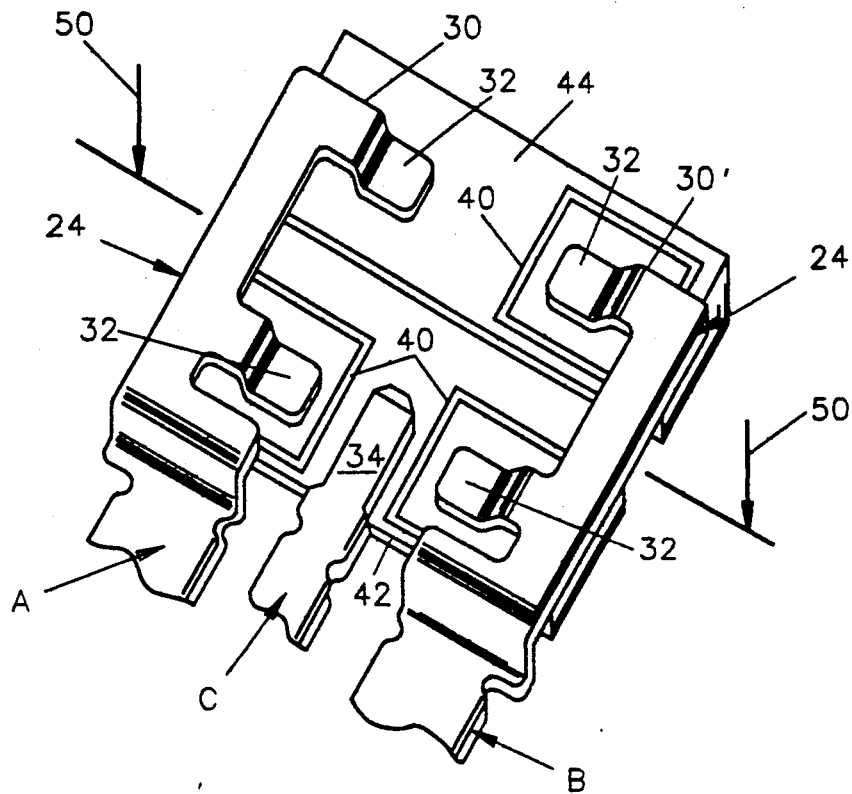
FIG. 9 is a perspective view of a portion of a partially assembled device shown in FIGS. 5 and 6.
Figure 10:
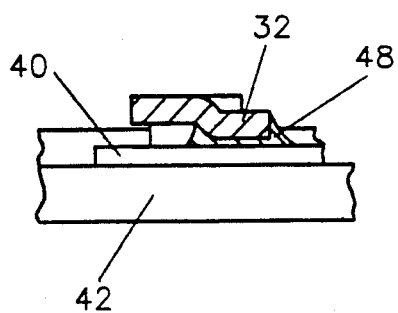
FIG. 10 is a broken away portion showing a soldered connection between a lead frame pad and an electrode of a semiconducting element as used in either embodiment.
Figure 11:
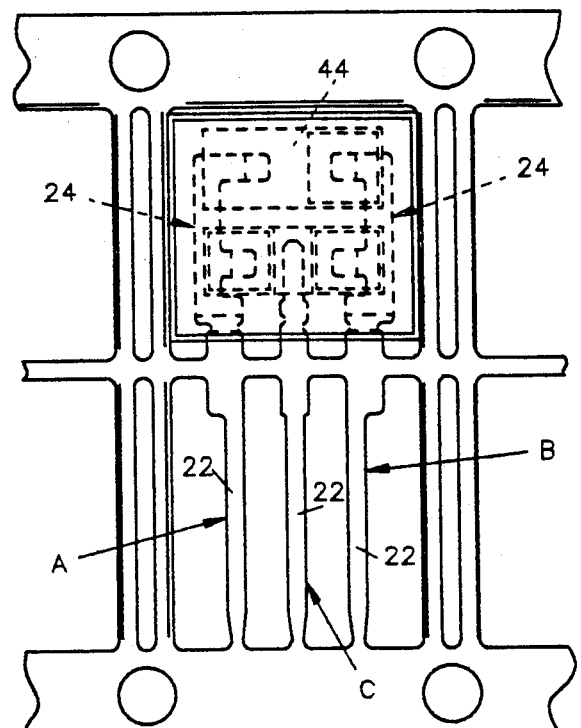
FIGS. 11 and 12 are views similar to FIGS. 5 and 6 respectively but showing the device encapsulated but before being severed from the lead frame.
Figure 12:
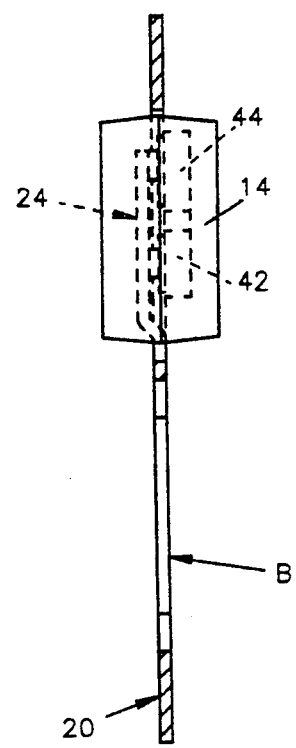

Prior to placing the heat sinks beneath pads 32 a selected amount of solder is placed on each top electrode and then, as indicated by arrows 50 in FIG. 9, a force 50 is placed on platform portion 24 to bias pads 32 into engagement with the top electrodes of semiconducting elements 40 through a thin layer of solder 48 as seen in FIG. 10. The actual spacing between pads 32 and the electrodes being on the order of 0.002 inches or less. Solder 48 is formed of highly electrically conductive material and is relatively viscous above its eutectic temperature. A suitable solder comprises, for example, 65% tin, 25% silver and 10% antimony. This particular solder is characterized in having reflow properties that result in containing the solder in the desired electrode area only and results in electrical resistance level on the order of less than 1 milliohm. The eutectic is approximately 232° C. and is applied in the form of paste which forms a meniscus with the side wall defining the lower surface of pad 32, as seen is FIG. 10. A sufficient quantity of solder is placed on the top electrode so that in the event of destruction of the semiconducting element, the solder will melt and there will be a sufficient amount to fill voids in the silicon to form an electrical bridge from pad 32 to the bottom electrode of element 40 aligned therewith and heat sink 42. On the other hand, care must be exercised in not placing so much solder on the top electrode that when pad 32 is originally soldered the berm could be bridged rendering the device unusable.

Figure 8:
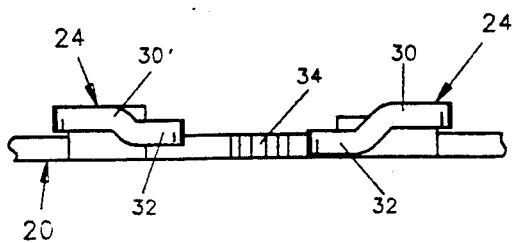

As best seen in FIG. 8, platforms 24 are raised up above the plane in which lead frame 20 lies providing clearance between the platforms and the semiconducting elements and with fingers 30 and 30' extending downwardly and toward each other. Pad 32 of finger 30 lies in the plane of the lead frame while pad 32 of finger 30' is spaced above the plane of the lead frame a distance selected to accommodate the thickness of semiconducting element 40. Pad 32 of both fingers 28 are spaced above the plane of the lead frame also to accommodate respective semiconducting elements. Thus pads 32 of finger 30 and pad 34 of lead C, lying in the same plane as the lead frame, are soldered to respective heat sink plates 44, 42 while pads 32 of fingers 28, 28 and 30' are soldered to the top electrode of respective semiconductor elements 40 while force 50 is placed on platforms 24 to ensure that the pads 32 of fingers, 28, 28 and 30' are essentially contiguous with a respective top electrode.

After the soldering step has been completed, force 50 is removed and the platforms 24 of leads A and B and pad 34 of lead C along with the heat sink plates 42, 44 and semiconducting elements 40 are overmolded in suitable thermally conductive, electrically insulating material 14. For example, a suitable resinous material being filled with 70–80% alumina and 5–10% silica has been found to be acceptable. After curing of the overmold the protection device is severed from the lead frame along with the strip joining leads A, B and C.

The protective device made as described above provides balanced surge protection between the tip and ring lines, tip and common and ring and common, i.e., between A and B, A and C and B and C.

Figure 13:
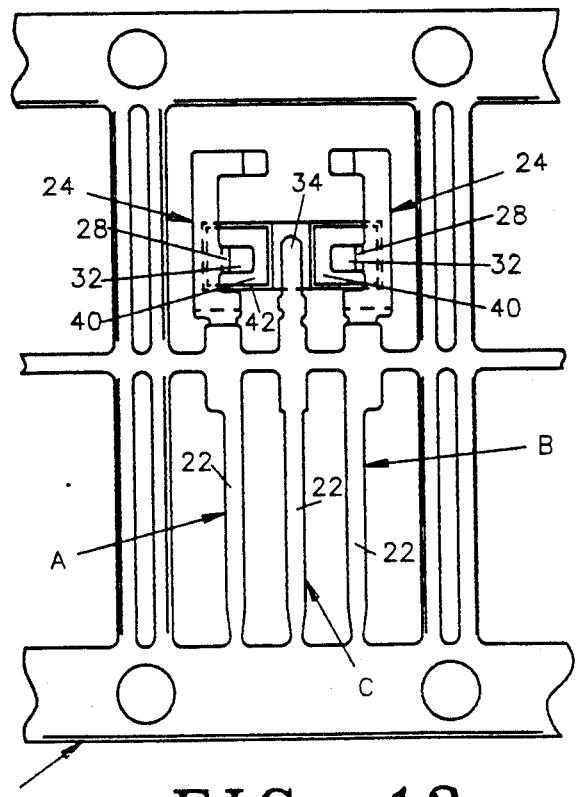
FIGS. 13 and 14 are views similar to FIGS. 5 and 6 respectively of a partially assembled device shown schematically in FIG. 1.
Figure 14:
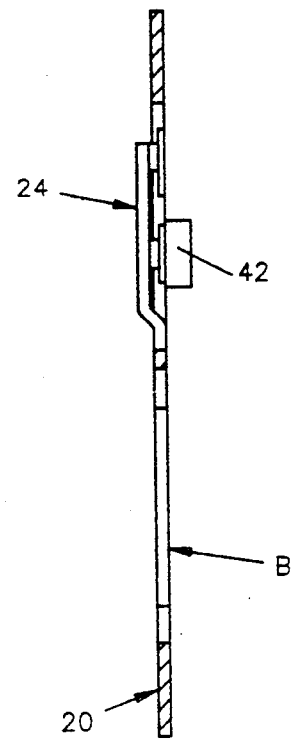

FIGS. 13 and 14 show an embodiment also shown in FIG. 1, in which protection is provided between tip and common and ring and common by using first and second semiconducting elements 40 mounted on heat sink plate 42. Pad 32 of fingers 28 are soldered to the top electrode of a respective semiconducting element after a force is applied to ensure that the pad is essentially engaged with the top electrode as in the previous embodiment. Pad 34, lying in the plane of lead frame 20 is soldered at the same time to heat sink plate 42. The device is then encapsulated and severed from the lead frame in the same manner as in the previously described embodiment.

Devices made in accordance with the invention provide a desired first level of surge protection in a reliable and efficient way and are adapted to provide the second level of surge protection with improved speed and reliability by failing in a closed or short circuit condition without any moving parts to provide proper protection for circuit components and telecommunication equipment in the novel surge protection system of the invention.

It should be understood that although particular embodiments of the invention have been described by way of illustrating the invention, the invention includes all modifications and equivalents of the disclosed embodiments falling within the scope of the appended claims.

We claim:

1. A surge protection device for protecting telecommunication equipment coupled to telephone ring, tip and common lines comprising a silicon semiconducting element having a reverse breakdown PN junction and having an upper and a lower surface, a first electrode disposed on the upper surface and a second electrode disposed on the lower surface, a generally flat electrically conductive heat sink plate, the silicon semiconducting element mounted on the heat sink plate with the second electrode in electrical and heat connection therewith, a first lead having a terminal portion lying in a plane, the lead having a platform portion disposed above the terminal portion and having a finger extending downwardly toward the plane and having a flat pad with sidewalls and a bottom surface, the bottom surface being in physical engagement with the first electrode through a thin layer of solder and being soldered thereto with sufficient solder that the solder wicks upwardly onto the sidewalls of the pad forming a meniscus therewith and a second generally flat lead lying in the plane having a distal end portion being physically and electrically connected to the heat sink and electrically insulative, heat conductive material encapsulating the element, heat sink plate and portions of the first and second leads whereby destruction of the silicon semiconducting element creating voids in the silicon caused by excessive voltage and current conditions result in melting the solder between the pad of the first lead and the first electrode which, upon melting, flows into the voids in the silicon element between the first and second electrodes to cause the surge protection device to fail closed preventing current from reaching telecommunication equipment coupled to the telephone lines.

2. A surge protection device according to claim 1 in which the first lead is formed of flat nickel plated copper material having a cross section of 800 square mils.

3. A surge protection device according to claim 1 in which two silicon semiconductor elements each having a reverse breakdown PN junction are mounted on the heat sink plate and a pair of first leads having a platform and a finger with a pad are provided, each element having a respective first lead electrically connected thereto.

4. A surge protection device according to claim 3 further including a second generally flat electrically conductive heat sink plate, and a third silicon semiconducting element having a reverse breakdown PN junction is mounted on the second heat sink plate, the pair of first leads having a second finger extending downwardly toward the plane and having a flat pad, the pad of one second finger being soldered to a first electrode disposed on the top surface of the semiconducting element and the pad of the other second finger being soldered to the second heat sink plate.

5. A surge protection device according to claim 1 in which the electrically conductive solder for soldering the distal end portion to the first electrode comprises approximately 65% tin, 25% silver and 10% antimony.

* * * * *